(12) United States Patent
Bedjaoui et al.

(10) Patent No.: US 11,254,567 B2
(45) Date of Patent: Feb. 22, 2022

(54) METHOD FOR ENCAPSULATING A MICROELECTRONIC DEVICE, COMPRISING A STEP OF THINNING THE SUBSTRATE AND/OR THE ENCAPSULATION COVER

(71) Applicant: COMMISSARIAT A L'ENERGIE ATOMIQUE ET AUX ENERGIES ALTERNATIVES, Paris (FR)

(72) Inventors: Messaoud Bedjaoui, Voreppe (FR); Raphael Salot, Lans-en-Vercors (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 20 days.

(21) Appl. No.: 16/965,524

(22) PCT Filed: Jan. 24, 2019

(86) PCT No.: PCT/FR2019/050153
§ 371 (c)(1),
(2) Date: Jul. 28, 2020

(87) PCT Pub. No.: WO2019/150019
PCT Pub. Date: Aug. 8, 2019

(65) Prior Publication Data
US 2021/0047177 A1    Feb. 18, 2021

(30) Foreign Application Priority Data

Jan. 30, 2018    (FR) ...................................... 18 50735

(51) Int. Cl.
*B81C 1/00*    (2006.01)
*H01L 23/29*    (2006.01)

(52) U.S. Cl.
CPC ........ *B81C 1/00269* (2013.01); *H01L 23/298* (2013.01); *B81C 2203/019* (2013.01); *B81C 2203/0118* (2013.01)

(58) Field of Classification Search
CPC .................................................. B81C 1/00269
(Continued)

(56) References Cited

U.S. PATENT DOCUMENTS

2005/0263866 A1    12/2005  Wan
2008/0003493 A1*   1/2008  Bates ................ H01M 10/0585
                                                            429/66
(Continued)

FOREIGN PATENT DOCUMENTS

EP    2 581 338 A1    4/2013
EP    2 677 538 A1    12/2013
(Continued)

OTHER PUBLICATIONS

Salot, R. et al., "Microbattery technology overview and associated multilayer encapsulation process," Applied Surface Science, vol. 256, No. 3, Nov. 15, 2009, XP026776645, pp. S54-S57.
International Search Report dated Apr. 12, 2019 in PCT/FR2019/050153 filed on Jan. 24, 2019, 2 pages.
(Continued)

*Primary Examiner* — Ajay Arora
(74) *Attorney, Agent, or Firm* — Oblon, McClelland, Maier & Neustadt, L.L.P.

(57) ABSTRACT

A method for encapsulating a microelectronic device, arranged on a support substrate, with an encapsulation cover includes, inter alia, the following sequence of steps: a) providing a support substrate on which a microelectronic device is arranged, b) depositing a bonding layer on the first face of the substrate, around the microelectronic device, c) positioning an encapsulation cover on the bonding layer in such a way as to encapsulate the microelectronic device, d) thinning the second main face of the support substrate and
(Continued)

the second main face of the encapsulation cover by chemical etching.

17 Claims, 5 Drawing Sheets

(58) Field of Classification Search
USPC .......................................... 257/678; 438/106
See application file for complete search history.

(56) References Cited

U.S. PATENT DOCUMENTS

| | | |
|---|---|---|
| 2009/0029500 A1 | 1/2009 | Wan |
| 2011/0012248 A1 | 1/2011 | Reichenbach et al. |
| 2013/0089955 A1 | 4/2013 | Baillin et al. |
| 2013/0277777 A1 | 10/2013 | Chang et al. |
| 2014/0008779 A1 | 1/2014 | Okuno et al. |
| 2016/0009551 A1 | 1/2016 | Chang et al. |
| 2017/0111994 A1 | 4/2017 | Bedjaoui et al. |
| 2017/0237229 A1* | 8/2017 | Menezo .................. G02F 1/025 385/3 |

FOREIGN PATENT DOCUMENTS

| | | |
|---|---|---|
| EP | 3 157 050 A1 | 4/2017 |
| WO | WO 2015/092254 A1 | 6/2015 |

OTHER PUBLICATIONS

French Search Report dated Oct. 17, 2018 in French Application No. 1850735 filed on Jan. 30, 2018, 1 page.

* cited by examiner

METHOD FOR ENCAPSULATING A MICROELECTRONIC DEVICE, COMPRISING A STEP OF THINNING THE SUBSTRATE AND/OR THE ENCAPSULATION COVER

TECHNICAL FIELD AND PRIOR ART

The present invention relates to a method for encapsulating a microelectronic device, disposed on a support substrate, with an encapsulation cover, the method comprising a step of thinning the support substrate and/or the encapsulation cover.

The present invention also relates to a microelectronic structure, obtained by such a method.

In recent years, microelectronic components, and more particularly, all-solid thin-layer microbatteries have become essential in the development of on-board intelligent systems. These intelligent systems are, for example, used in applications called Internet of Things, energy storage, energy recovery, organic and inorganic electronics, or even the field of power.

The development of these intelligent systems should lead to a miniaturisation of microelectronic components, and in parallel to the use of increasingly thin support substrates. The substrates used for these systems must be thin (typically having a thickness of less than 100 µm) or even ultra-thin (thickness of less than 50 µm).

Microelectronic devices, and in particular lithium microbatteries, have a very high sensitivity to atmospheric elements such as oxygen and water vapour. These devices must therefore be encapsulated to guarantee their electronic or electrochemical but also mechanical integrity over time. The performances of encapsulation systems are frequently expressed in terms of Water Vapour Transmission Rates (WVTR) or in Oxygen Transmission Rate (OTR). In the specific case of lithium microbatteries, the WVTR and OTR levels required are respectively of the order of $10^{-4}$ $g/m^2/d$ and $10^{-4}$ $cm^3/m^2/d$. In practical terms, to meet the criteria for miniaturisation of microelectronic devices, the cover must also be thin or ultra-thin.

Nevertheless, in practice, the substrates and/or the covers are subjected to numerous technological steps (transfer, deposition, etching, cleaning, etc.). However, the handling of thin substrates is very restrictive because of their mechanical weaknesses.

In order to overcome this problem, fragile substrates can, conventionally, be temporarily fixed to solid supports to facilitate their handling and manipulation during the technological steps, as for example described in document WO-A-2015/092254. Nevertheless, this solution requires carrying out a fairly complex step of detaching the thin substrate from its rigid support at the end of the method, for example, by inserting a blade between the substrate and the temporary support or by applying a shearing or traction on the substrate. In addition, some temporary bonding solutions are not adapted for microelectronic devices whose methods require thermal budgets with temperatures higher than 300° C. Finally, such bonding and detaching steps lead to an increase in manufacturing costs and/or production times.

DESCRIPTION OF THE INVENTION

It is consequently a purpose of the present invention to provide an encapsulation method overcoming the disadvantages of the prior art and, particularly, to provide a method for encapsulating microelectronic devices sensitive to air and/or to high temperatures with a thin or ultra-thin substrate and/or cover, the method having to be easy to implement and not requiring a detaching step as in the prior art.

This purpose is achieved by a method for encapsulating a microelectronic device, disposed on a support substrate, with an encapsulation cover comprising the following successive steps:

a) providing a support substrate, made of a first material, comprising a first main face on which a microelectronic device is disposed, and a second main face opposite the first main face, b) depositing a bonding layer, made of a second material, on the first face of the substrate, around the microelectronic device, c) positioning an encapsulation cover, made of a third material, comprising a first main face and a second main face, opposite the first main face, on the bonding layer, so as to fix the first main face of the encapsulation cover on the support substrate, and so as to encapsulate the microelectronic device, d) thinning, by chemical etching, the second main face of the support substrate and the second main face of the encapsulation cover to a thickness less than 200 µm, preferably less than or equal to 100 µm and even more preferably less at 50 µm.

The method according to the invention is simple to implement, it requires few technological steps. The method of the invention does not implement temporary securing and detaching steps. At the end of the encapsulation method, the microelectronic device is encapsulated, on the one hand, with a substrate, which can be thin or ultra-thin, and, on the other hand, by a cover which can be thin or ultra-thin.

Thin means a thickness less than 200 µm, and preferably less than 100 µm, and ultra-thin means a thickness less than 50 µm.

The method of the present invention allows to obtain miniaturised devices whose microelectronic devices are protected from air and its oxidants.

The thinning step d) is carried out by chemical etching. The etching conditions are well controlled with respect to mechanical etching, which avoids the formation of defects in microelectronic devices.

Advantageously, the second main face of the support substrate and the second main face of the encapsulation cover are thinned simultaneously during step d).

Advantageously, the first material and/or the third material are selected from glass and silicon. These materials have good barrier properties.

According to a first advantageous variant, the first material and the third material are identical. The thinning of the support substrate and of the encapsulation cover can be carried out simultaneously and at the same etching rate, for example, by immersing, or spraying, the assembly with a chemical etching solution. The thinning can be controlled according to the immersion or spray time and the chemical composition of the liquids used.

According to a second advantageous variant, the first material and the third material are different. It is possible to etch only the encapsulation cover or the support substrate, to etch them successively or to etch them simultaneously at different rates.

According to a particularly advantageous embodiment, during step b), the bonding layer completely covers the microelectronic device.

According to another particularly advantageous embodiment, during step b), the bonding layer forms a sealing bead around the microelectronic device.

Advantageously, in this advantageous embodiment, the sealing bead is made of glass paste, and the sealing bead is surrounded by a protective layer made of a fourth material.

Advantageously, the second material and/or the fourth material is a polymer material selected from epoxies, ethers, polysiloxanes, acrylics, one of their copolymers, and polyethylene terephthalate.

Advantageously, at the end of step d), the encapsulation cover and/or the support substrate have a thickness less than or equal to 100 µm, and preferably, less than 50 µm.

Advantageously, the microelectronic device is an electrochemical device, such as a lithium microbattery.

Advantageously, several identical or different microelectronic devices are disposed on the first face of the support substrate and/or on the first main face of the encapsulation cover.

The method according to the invention authorises several configurations in terms of number and positioning of microelectronic devices. For example, it is possible to stack two microbatteries.

The invention also relates to a microelectronic structure, obtained by the method as defined above, comprising a microelectronic device, for example an electrochemical device, such as a lithium microbattery, disposed on a support substrate, made of a first material, the device being surrounded by a bonding layer, made of a second material, on which is fixed an encapsulation cover, made of a third material, the encapsulation cover and/or the support substrate having a thickness less than 200 µm, preferably, less than or equal to 100 µm and even more preferably less than 50 µm.

According to a first embodiment, the bonding layer completely covers the microelectronic device.

According to a second embodiment, the bonding layer forms a sealing bead, made of glass paste, around the microelectronic device, the sealing bead being surrounded by a protective layer made of a fourth material.

The features related to the method are found for the microelectronic structure.

BRIEF DESCRIPTION OF THE DRAWINGS

The present invention will be better understood based on the description which follows and the appended drawings wherein.

Figure 1:
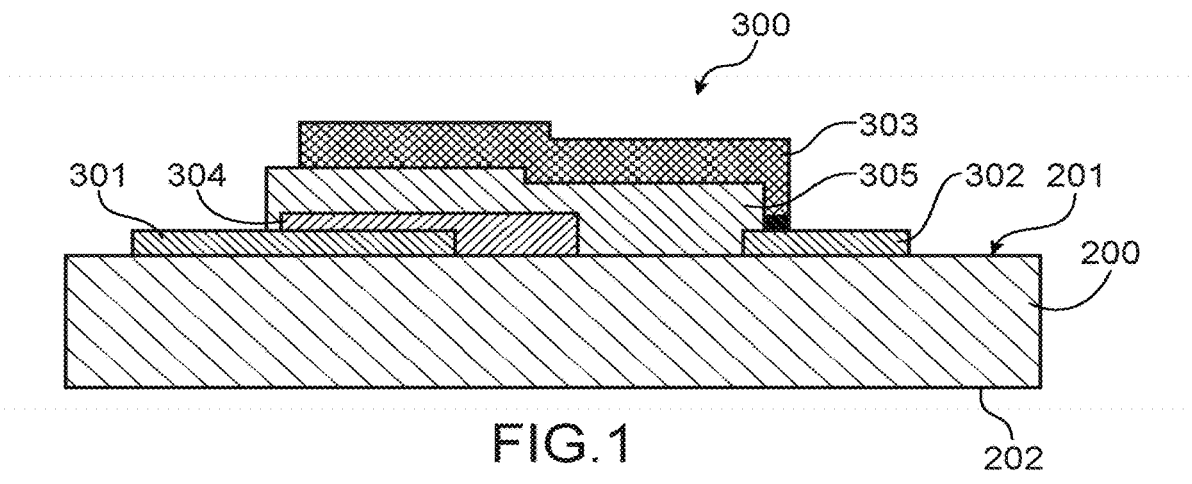
FIG. 1 is a sectional and profile schematic representation of a microbattery on a support substrate, according to a particular embodiment of the invention.

The different parts shown in the figures are not necessarily shown on a uniform scale, to make the figures more readable.

The different possibilities (variants and embodiments) must be understood as not being mutually exclusive and capable of being combined with one another.

DETAILED DESCRIPTION OF PARTICULAR EMBODIMENTS

The method for encapsulating at least one microelectronic device, for example, sensitive to air (to oxygen and to water vapour), with an encapsulation cover, will now be described. The method comprises the following successive steps:

a) providing a support substrate 200, made of a first material, comprising a first main face 201 on which a microelectronic device 300 is disposed, and a second main face 202 opposite the first main face 201, b) depositing a bonding layer 500, made of a second material, on the first face 201 of the support substrate 200, around the microelectronic device 300, c) positioning an encapsulation cover 400, made of a third material, comprising a first main face 401 and a second main face 402, opposite the first main face 401, on the bonding layer 500, so as to fix the first main face 401 of the encapsulation cover 400 on the support substrate 200, and so as to encapsulate the microelectronic device 300, d) thinning the second main face 202 of the support substrate 200 and/or the second main face 402 of the encapsulation cover 400 to a thickness less than 200 µm, for example, to a thickness less than or equal to 100 µm and preferably less than 50 µm.

Support Substrate 200 and Encapsulation Cover 400:

The support substrate 200, also called host substrate or support substrate, provided in step a), is preferably a rigid substrate.

The encapsulation cover 400, provided in step c), is preferably a rigid encapsulation cover.

Rigid means any support easily usable in microelectronics having a thickness greater than 200 µm. For example, the substrate 200 and/or the encapsulation cover 400 initially have a thickness greater than 250 µm, for example of 500 µm. Preferably, the substrate 200 and the cover 400, provided in steps a) and c), initially have a thickness greater than 200 µm and are both thinned during step d) or during step d) and a subsequent step.

The substrate 200 and the encapsulation cover 400 may have identical or different thicknesses. The thickness of the cover may be less than that of the substrate 200 or vice versa. This possible configuration allows to produce microelectronic devices whose encapsulation cover is thinner than the substrate 200 or vice versa.

Figure 2:
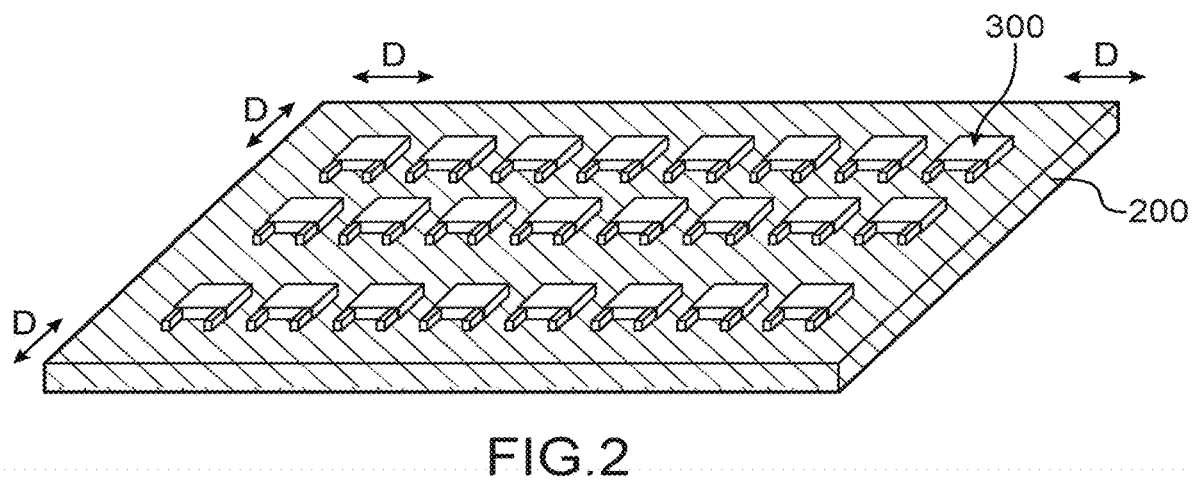
FIG. 2 is a three-dimension schematic representation of a support substrate on which several microbatteries are disposed, according to another particular embodiment of the invention.

As shown in FIGS. 1 and 2, the substrate 200 has a first main face 201, and a second main face 202. The first face comprises at least one microelectronic device 300. It is the face called active face. The substrate also comprises a lateral face going from the first face to the second face.

The cover 400 comprises a first main face 401, and a second main face 402, as well as a lateral face going from the first face 401 to the second face 402.

The substrate 200 and the encapsulation cover 400 may have identical or different geometric shapes. It is possible, for example, to use wafer-type circular formats or sheet formats, that is to say rectangular formats.

The support substrate 200 is made of a material which is identical or different from that of the encapsulation cover.

The substrate 200 and/or the encapsulation cover 400 advantageously have the performance required for the encapsulation of lithium microbatteries. They are made of a material having WVTR and OTR barrier levels at most, respectively of $10^{-4}$ g/m²/d and of $10^{-4}$ cm³/m²/d to guarantee sufficient tightness properties for the air and water vapour to the sealant cell.

The support substrate 200 and the encapsulation cover 400 can be selected from glasses, (monocrystalline or polycrystalline) silicon, ceramics, mica, and quartz. Preferably, they are made of glass. They can be made of a glass from the same family or from different families.

The glasses can be borosilicates (such as D263®LA, D263® M, D263® T, MEMpax® or else Borofloat® marketed by the company SCHOTT®), derivatives of borosilicates such as alkali-free borosilicate glasses (AF32®, AF45, Corning®Willow, etc.) or else glasses of the alkaline earth boro-aluminosilicate type marketed for example by the companies Corning Lotus™, EAGLE XG®, etc.

Preferably, the cover 400 is transparent to the wavelengths of the lasers conventionally used for freezing sealing beads (typically for sealing beads made of glass paste, around 940 nm). Transparent means that the cover passes at least 50% of the light emitted by the laser so as to be able to heat the sealing bead through the cover 400.

Preferably, the support substrate 200 and the encapsulation cover 400 have identical thicknesses and are made of the same material.

Microelectronic Device 300 to be Encapsulated:

The method allows to simultaneously encapsulate a device or several microelectronic devices 300. The electronic device 300, or microelectronic component, has a thickness ranging from 5 μm to 30 μm, and preferably from 10 to 15 μm.

One or more electronic devices 300 of the same type or of different types can be disposed on the first main face 201 of the substrate 200. This configuration provides the possibility of producing functional stacks by 3D integration.

The encapsulation cover 400 may be a passive or active element, i.e. the first face 401 of the cover 400 may include microelectronic devices 300 of the same nature or of different natures with respect to those of the substrate 200, which can perform other functionalities.

The support substrate 200 and/or the encapsulation cover 400 may include one or more microelectronic devices 300 to multiply the electrochemical performances by placing the microelectronic components in parallel or in series. Microelectronic devices can be, for example, selected from microbatteries, capacitors, supra-capacitors, photovoltaic components, transistors, antennas or any other device deemed necessary for producing connected objects.

Advantageously, the microelectronic components of the substrate and of the cover are positioned facing one another in order to be able to associate them according to a 3D stacking approach.

Microelectronic component 300 means, for example, a MEMS (electromechanical microsystem), a MOEMS (opto-electro-mechanical microsystem), or else an infrared microdetector, or even a transistor. More generally, microelectronic component means any device intended to be encapsulated under a controlled atmosphere.

Subsequently, even if the description refers in particular to a microbattery, and more particularly to a lithium microbattery, the invention can be applied to any microelectronic component requiring protection against oxidants. It can be, for example, a capacitive stack or an electrochromic component.

The microelectronic component 300, here the microbattery, is disposed on one of the faces 201 (first main face) of the substrate 200. The microbattery comprises cathode 301 and anode 302 current collectors, disposed on the substrate 200. Two active layers, one forming the negative electrode 303, and the other forming the positive electrode 304, are separated by an electrolyte layer 305. Each active layer 303, 304 is in contact with one of the current collectors 301, 302.

The current collectors 301, 302 are advantageously metallic current collectors. As an illustration, they can be made of titanium, gold, aluminium, platinum, or tungsten.

The positive electrode 304 (cathode) is made of a material with good electronic and ionic conductivity (for example TiOS, $TiS_2$, LiTiOS, $LiTiS_2$, $LiCoO_2$, $V_2O_5$, etc.). Preferably a positive cobalt oxide electrode will be selected. This type of cathode is considered to be one of the most efficient layers for microbatteries and at the same time the most constrained during the production steps. Indeed, the mechanical stresses generated after forming the cathode layer (Coefficient of thermal expansion between $10 \times 10^{-6}$/° C. and $15 \times 10^{-6}$/° C. and a Young's modulus between 100 and 500 GPa) can influence the behaviour of rigid substrates once thinned.

The electrolyte 305 is an electronic insulator with high ionic conductivity (for example LiPON, LiPONB, LiSiCON, etc.).

The negative electrode 303 (anode) is a layer which can be metallic lithium or a lithiated material.

Optionally and according to the configurations, the active layers can be protected by a primary encapsulation system, not shown, comprising one or more elementary barrier layers, the main role of which is to guarantee the integrity of the microbattery devices during the different phases of the method.

The microbattery will be produced by techniques known to the person skilled in the art.

The microelectronic components 300 are positioned outside the peripheral contour of the support substrate and/or of the encapsulation cover to protect them, during the etching step, in particular in the case of chemical etching (where lateral grinding can take place). Advantageously, this space will be selected so as to be at least twice the thickness of the rigid substrate and/or of the encapsulation cover. This contour is represented by the letter D in FIGS. 2, 3A, 4A and 4C.

Figure 3A:
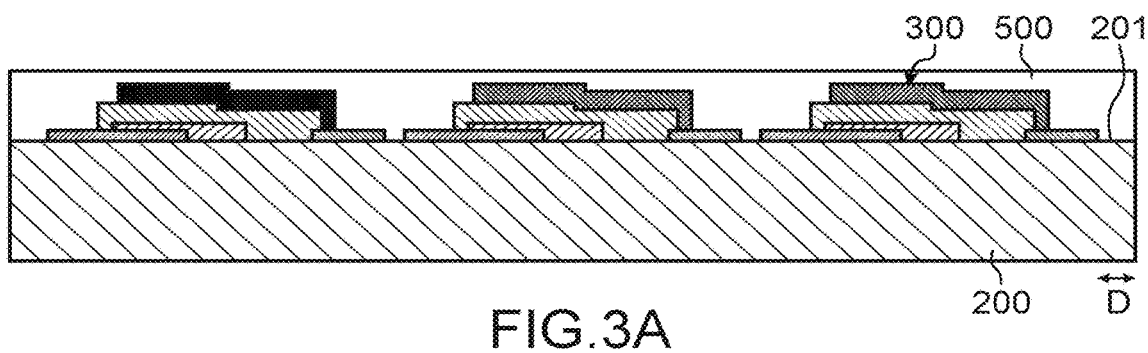
FIGS. 3A to 3C show the positioning of a bonding layer on a substrate including at least one microelectronic device, according to different embodiments of the method of the invention.
Figure 3B:
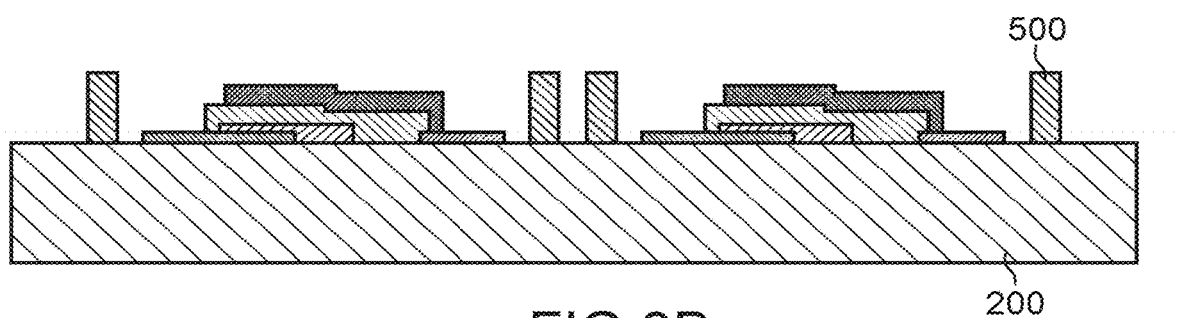
Figure 3C:
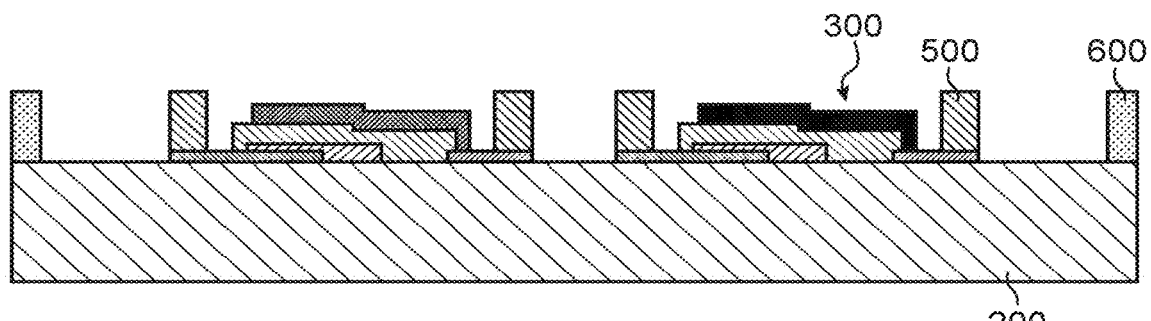

Bonding Layer 500:

As shown in FIGS. 3A, 3B and 3C, during step b), a bonding layer 500 is positioned on the first face 201 of the support substrate 200, on either side of the microelectronic device 300.

The bonding layer 500 has a thickness greater than or equal to that of the microelectronic component(s) 300 to be encapsulated.

The bonding layer 500 surrounds the microelectronic component 300, so as to form, after the transfer of the encapsulation cover 400 a protective barrier around the microelectronic component 300.

The bonding layer 500 has resistance properties with respect to etching, and in particular with respect to the chemical etching solution, to prevent the risk of infiltration of the chemicals to the active layers during the thinning step.

In general, the role of the bonding layer 500 is threefold. Indeed, it allows first of all to bond the encapsulation cover with the substrate 200 thanks to its adhesiveness performance. It also ensures the functionality of lateral protection of microbatteries from possible infiltrations of chemical etching solutions due to the chemical resistance properties to acids. Finally, the layer, by its polymeric nature, provides a solution for mechanical absorption of the volume expansion movements generated by the operation of the microbattery corresponding to the insertion/de-insertion of lithium during the charge and discharge cycles.

According to a first embodiment, shown in FIG. 3A, the bonding layer 500 can completely cover the first face 201 of the substrate 200. Completely means at least 90% of the surface of the first face 201 of the substrate 200.

For this purpose, during step b), the bonding layer 500 is spread over the entire surface of the substrate 200 including the microelectronic device, by any adapted technique. Different deposition techniques can be used to deposit the bonding layer 500. For liquid deposition, to form full-plate deposited bonding layers, the spin coating technique is favoured. The solution will advantageously have a viscosity of less than 1000 cPs. By modifying the rate and the rotation time of the spinner, the thickness of the bonding layer 500 can be varied. For example, in the case of an epoxy layer OG198-54, the total thickness may vary from 1 to 25 μm.

The bonding layer 500 is preferably obtained by polymerisation of a polymer which is photopolymerisable, for example under UV, or thermosetting. It can be a low viscosity polymer (for example, having a viscosity below 2000 cPs).

The polymer is from the family of epoxies, ethers, silicones, acrylates or one of their copolymers. The commercial polymers of the Epo-Tek series cross-linked by UV or thermally such as the products (OG198-54, UD1355, OG653, UG1192, T7110, H70E, etc.) can be selected.

Alternatively, the bonding layer 500 can be an adhesive film. The adhesive film is laminated on the substrate. The adhesive film will be selected according to its properties of bonding, conformability, electrical insulation and/or chemical compatibility with the active layers of the microbattery. It can be sensitive to pressure (Pressure sensitive Adhesive), temperature or UV rays. It can be obtained from polymer films based on acrylic, silicone, rubber or one of the mixtures thereof. In an indicative and non-exhaustive manner, the insulating adhesives marketed by Tesa, Henkel, 3M, Norland or Novagard can be used. For example, an adhesive layer Tesa61562 with a thickness of 25 μm marketed by the company Tesa will be used to secure the substrate and the cover. Securing can be carried out by a lamination method at a temperature of 90'C with a pressure greater than 1 bar and a rate less than 3 m/min.

One or more adhesives can be used to form the bonding layer 500.

The bonding layer 500 may also comprise particulate inclusions and/or oxygen and water absorbers (getters) to improve their tightness.

The bonding layer 500, deposited in step b), can be structured by photolithography or laser etching techniques.

According to a second embodiment, shown in FIGS. 3B and 3C, the bonding layer 500 can only partially cover the first face 201 of the substrate 200. Preferably, the bonding layer 500 forms a sealing bead around the microelectronic device.

The sealing bead 500 is positioned so that once the cover 400 is transferred on the substrate 200, the bead 500 surrounds the microelectronic component 300 to be encapsulated to isolate it from the atmosphere. In the case of microbatteries 300, the sealing bead 500 is, advantageously, disposed at the current collectors 301, 302 to save space and facilitate miniaturisation (FIG. 3C).

The sealing bead 500 is electrically non-conductive.

The sealing bead 500 can be made of a polymer material.

The sealing bead 500 is, advantageously, made from a glass paste. The glass pastes comprise glass particles dispersed in an organic binder. For example, a glass paste can contain at least 70% by mass of $SiO_2$ particles. The organic binder is destroyed by heating the glass paste. The glass pastes can be vitrified at temperatures ranging from 300° C. to 400° C. The vitreous glass pastes form the welds. They mechanically hold the cover 400 to the substrate 200. They are also tight to air oxidants.

Sintered glass beads generally have significantly higher air barrier properties than glues.

For example, the glass pastes marketed by Namics under the reference DM2700/H848, marketed by AGC (Asahi Glass Company) under the references 4290D1, 5115HT1, TNS062-Z27-TP12, 5290D1 or also marketed by Corning under the reference Vita™ can be considered for the production of the sealing bead 500. These glass pastes are compatible with the glass materials selected for the substrate 200 and/or for the closing and encapsulation cover 400.

Preferably, the bead 500 is produced from the DM2700P/H848 paste. In addition to its intrinsic barrier properties against oxidising species (WVTR and OTR values of the order of $10^{-6}$ $gm^{-2}d^{-1}$ and $10^{-6}$ $cm^3/m^2/d$), this product has good thermal properties (CET of $7.7\times10^{-6}$ $K^{-1}$ at 20° C.) very close to glass materials (CET of $7.2\times10^{-6}$ $K^{-1}$ at 20° C.). Furthermore, this product can be sealed with relatively short times under laser irradiation (of the order of 60 seconds), which limits the risks of heat propagation during the sealing step.

Alternatively, other products marketed by AGC under the reference 5115HT1 or by Corning under the reference Vita™ can be used in the production of the sealing bead 500.

The sealing bead 500 has a thickness which can vary from a few microns to a hundred microns. Thickness means the dimension perpendicular to the substrate/cover stack. Its thickness will be selected by the person skilled in the art in order to create, once the encapsulation method has been completed, a cavity between the substrate 200 and the encapsulation cover 400 sufficient to not disturb the charge and discharge cycles of the microbatteries. These cycles, which correspond to an insertion/de-insertion phenomenon of lithium between the two electrodes, generally result in phenomena of volume expansion of the electrodes. It is therefore essential to form a sufficiently high cavity for free vertical movement of the electrodes. The height of such a cavity depends on the difference in height between the thickness of the bead 500 and that of the stack of active layers of the battery 300. Typically, the minimum value of this height is fixed around 5% of the value of the total thickness of the microbattery 300. The width and the thickness of the sealing bead 500 are optimised depending on the size of the elements to be protected in order to effectively reduce the congestion of the surface of the cords 500 with respect to the total surface of the microbattery device. The width of the sealing bead 500 will be at least 100 μm, in the case of a substrate 200 with microbatteries 300. Such dimensions satisfy the required sealing and mechanical properties. For example, a thickness of 50 μm and a width of 100 μm will be used.

The bead 500 can be formed on the substrate 200 and/or on the encapsulation cover 400 using any adapted technique (exemption, for example by application with a pencil, with the brush, serigraphy or others).

When the sealing bead is made of glass paste, the sealing bead 500 is surrounded by a protective layer 600 made of a fourth material (FIG. 3C). The protective layer 600 forms a crown around the sealing bead 500 so as to protect it during chemical etching.

This protective layer 600, in the form of a peripheral ring, is preferably made of a polymer material judiciously selected because of its chemical resistance with respect to the etching step. The lateral protective layer 600 is preferably made of a polymer selected from epoxies, silicones, or else it can be a PSA adhesive, or a UV adhesive. Polyethylene terephthalate (PET) can also be selected.

After the glass paste deposition step, the sealing bead 500 obtained is advantageously vitrified by carrying out a heat treatment. The treatment temperature is, for example, from 100° C. to 160° C., for example of the order of 150° C. The duration of the treatment ranges, for example, from a few minutes to one hour, for example of the order of 30 minutes. This heat treatment advantageously allows to degas the solvents initially present in the glass paste (10 to 15% by volume).

Figure 4A:
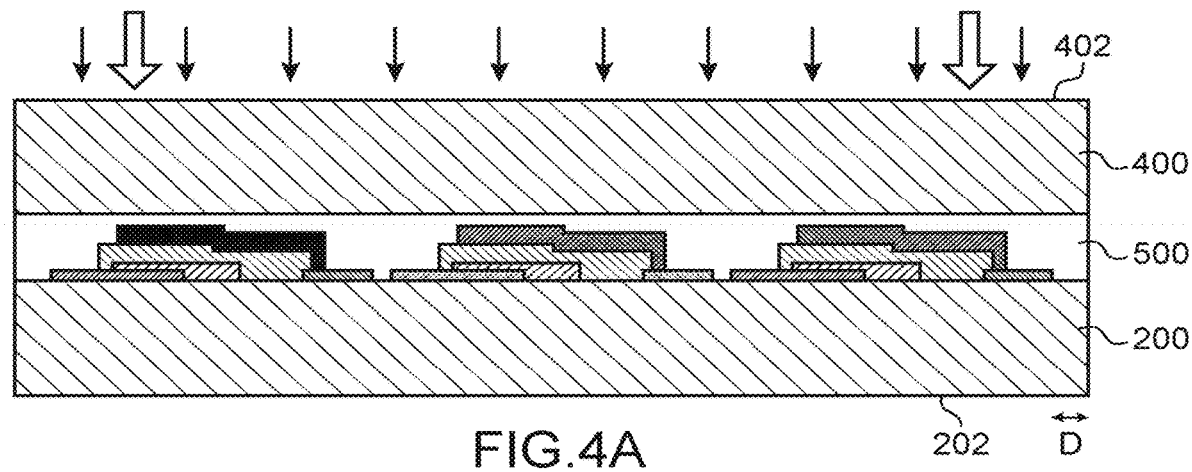
FIGS. 4A to 4C show at least one microelectronic device, on a substrate, encapsulated by a protective cover, according to different embodiments of the method of the invention.
Figure 4B:
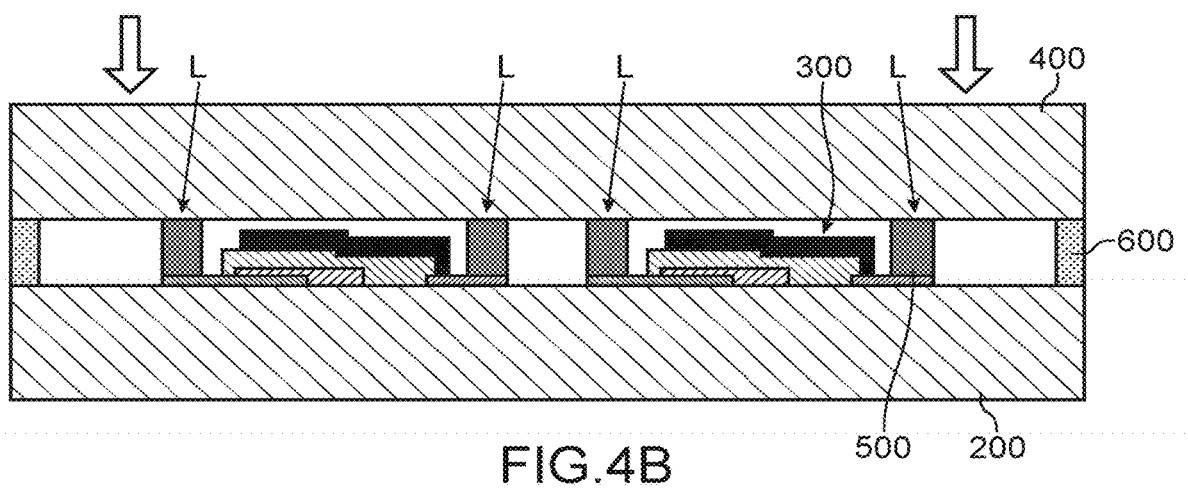
Figure 4C:
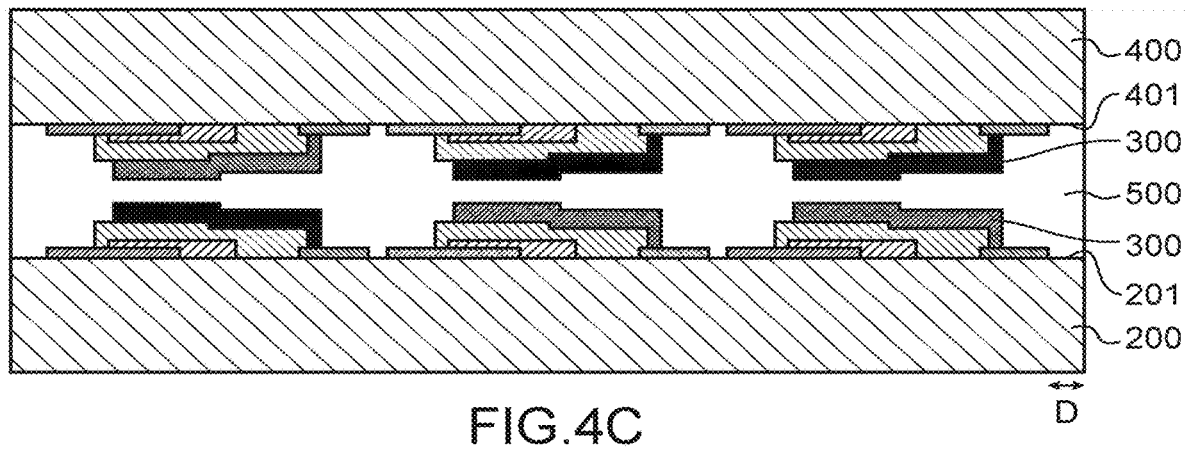

Positioning of the Encapsulation Cover 400:

As shown in FIGS. 4A, 4B and 4C, during step c), the encapsulation cover 400 is positioned above the substrate. A force F, of a few newtons, for example of about 2 N, represented by the large arrows in FIGS. 4A and 4B, can be applied during the positioning of the cover 400 to guarantee a homogeneous contact between the bonding layer 500 and the support substrate 200 and/or the encapsulation cover 400.

Irradiation with an ultra-violet source (represented by the thin arrows in FIG. 4A) and/or thermal heating can be used to consolidate and freeze the bonding layer 500, thus allowing the mechanical fixing of the support to the cover by means of the bonding layer 500.

For example, securing the basic structure is ensured by UV exposure through the encapsulation cover using a dose of about 100 mWatt/cm$^2$ within the wavelength range between 280 nm-800 nm for 2 mn. UV crosslinking can be supplemented by thermal annealing, for example, for a duration of 20 minutes and at a temperature of 100° C.

The sealing beads 500 are advantageously exposed to laser radiation through the upper face 402 of the encapsulation cover 400 using laser radiation to locally heat the sealing beads (FIG. 4B). The laser radiation is represented by the arrows L. Heating by laser irradiation is particularly advantageous since it does not require heating the entire substrate 200 and the cover 400. It allows to locally heat the cords 500 to more than 300° C., for example from 300° C. to 400° C. so as to vitrify them and form the welds, necessary for sealing. The cover 400 is thus permanently sealed on the substrate 200 containing the components 300.

Advantageously, a laser fibre will be selected to further locate the radiation.

The increase in temperature makes the materials of the cords 500 more easily deformable by the melting effect, and increases the contact surface between the bead 500 and the cover 400 or the substrate 200. The temperature can locally reach more than 500° C. during laser irradiation.

The main features of the lasers will be selected by the person skilled in the art according to the nature of the glass paste used for the bead 500 and the optical properties of the cover 400. More particularly, the available range of laser wavelengths will range from infrared ($CO_2$, Nd: YAG lasers, etc.) to ultraviolet light (Excimer laser and Nd: YAG harmonics). This provides the possibility of selecting the most appropriate wavelength to guarantee effective bonding of the glass pastes. For example, radiation at a wavelength in the near infrared range, typically at 940 nm, can be selected.

The bead 500 can be subjected to laser illumination for a duration ranging from a few tens of seconds to a few hundred seconds.

The sealing can be carried out by laser scanning. The beam can displace at a rate of a few mm/s, for example of the order of 2 mm/s.

For example, a laser illumination at a power of 80 W for 60 s, with a displacement of 2 mm/s is sufficient to cause abrasion of the bead 500 allowing to permanently seal the encapsulation cover with the rigid substrate containing the devices to be encapsulated.

This step allows to vitrify and weld the sealing beads, to ensure mechanical cohesion and sealing of the encapsulation.

The method is advantageously carried out in an inert environment, so as to fill the cavities, delimited by the substrate 200, the cover 400 and the sealing bead 500, with an inert gas. Getters can also be used to trap oxygen and water vapour. The method is, for example, carried out in a glove box.

Figure 5:
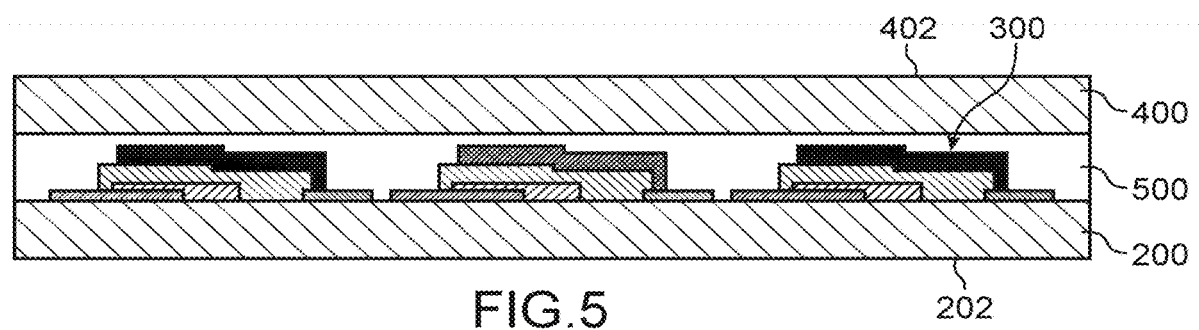
FIGS. 5 and 6 show different steps of the method for encapsulating microelectronic devices, according to a particular embodiment of the invention.

Thinning of the Support Substrate 200 and/or the Encapsulation Cover 400:

The thinning step, carried out during step d), allows to obtain a cover and/or a substrate having a controlled thickness and roughness (FIG. 5).

Preferably, the thinning is carried out with an etching step. Even more preferably, it is a chemical etching (chemical grinding). One of the major advantages of chemical grinding compared to mechanical grinding is the low stress caused by chemical thinning.

The solution used for chemical etching will be selected by the person skilled in the art so as to be adapted for etching the second face 402 of the cover 400 and/or the second face 202 of the substrate 200.

For example, to etch silicon elements, it will be a solution which is basic in nature. The etching solution can be potassium hydroxide (KOH) at a temperature of 80° C. allowing an etching rate of the order of 1.5 μm/min. In the case of the use of a solution which is basic in nature, preference will be given to materials of the polysiloxane (silicone) type for bonding the basic structure for their resistance to basic solutions.

To etch glass elements, an acidic etching will be selected. It can be an etching solution very concentrated in hydrofluoric acid HF (49%), a mixture HF with hydrochloric acid HCl, or else a mixture between HF, water and nitric acid. For example, in the case of an alkali-free glass, a chemical solution comprising a balanced mixture with 10% hydrochloric acid (HCl) and 2% hydrofluoric acid (HF) allows to have a rate of standard etching (25° C.) up to 1 μm/min. This value can be of the order of 2 μm/min for an etching solution heated to 35° C. The mixtures can be adjusted to increase the etching rate, thus a mixture of 10% HF and 37% HCl allows to reach rates of 4 μm/min. Etching rate values between 20 and 30 μm/min can be reached by adjusting the proportions of each constituent and/or by increasing the temperature.

In general, the etching solutions can be adapted in temperature and composition depending on the materials to be etched (silicon, glass), the desired final thicknesses and/or the desired surface roughness. It is possible to consider a chemical etching in solutions, called baths, in batch mode (soaking) or by jet (spray) in series.

Liquids have the chemical composition adapted to the nature of the materials used in the manufacture of substrates and covers. This operation can be carried out individually (a single structure by running in line or immersion in a bath) or collectively by batch of several structures at the same time.

The etching step is advantageously followed by a step of rinsing with deionised water and by drying, for example, under a flow of air or neutral gas. These sequences of rinsing/drying operations can be repeated many times until total elimination of the residues of the acid mixture used in the etching.

When the support substrate 200 and the encapsulation cover 400 are made of the same material, for example glass, a single etching solution can be used to etch them simultaneously.

When the support substrate 200 and the encapsulation cover 400 are made of two different materials, for example, one made of glass and the other made of silicon, two different etching solutions can be used successively.

The person skilled in the art will select for the bonding layer 500 and/or for the protective layer 600 a material resistant to the different etching solutions used during the method.

Formation of Electrical Contacts 700 and/or Cutting of the Substrate 200 and/or the Cover 400:

After the thinning step, a subsequent step wherein the contacts 700 are released and/or wherein the various microelectronic devices are separated into unitary elements is carried out.

Figure 6:
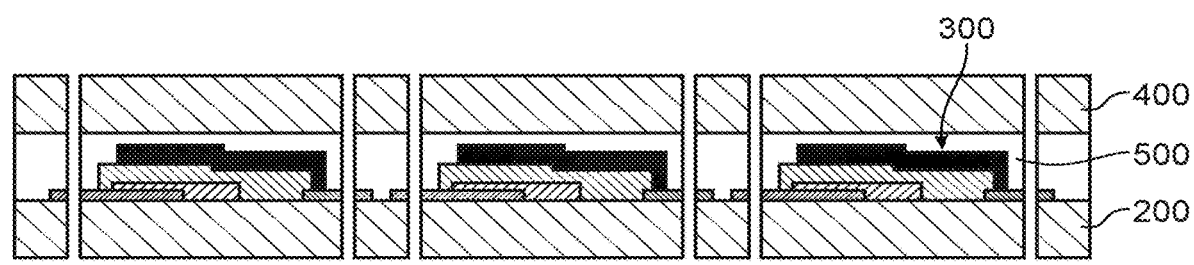

First, openings are made in the encapsulation cover 400 (FIG. 6). This step can be carried out by any cutting method known to the person skilled in the art and adapted to the materials of the substrates and/or the covers. In particular, a mechanical saw cutting (sawing) or a laser cutting ($CO_2$ laser, YAG laser, picosecond laser, femtosecond laser or excimer laser). The openings have, for example, a diameter of 100 µm to 500 µm.

The openings are then filled with an electrically conductive element 700, such as a metal or a metal alloy, or an electrically conductive resin. For example, it is possible to select a resin based on electrically conductive polymers, such as the resin E4110 marketed by the company Epo-Tek. A heat treatment can then be carried out.

It is also possible to laminate an electrically conductive film or to electrodeposit electrically conductive layers in the openings.

Figure 7A:
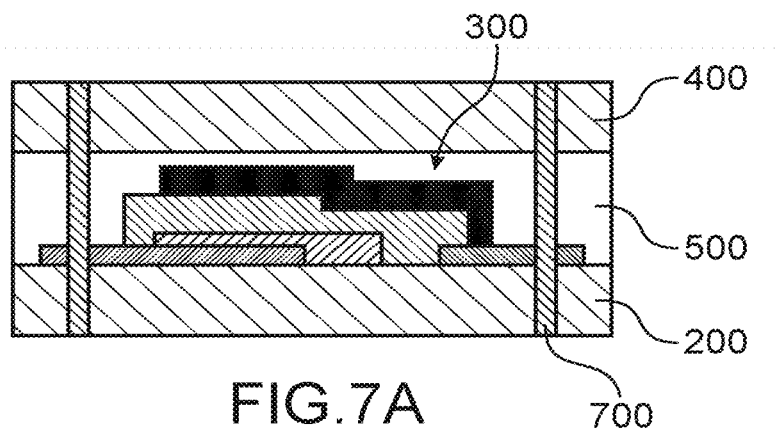
FIGS. 7A to 7C show a miniaturised system comprising a microelectronic device, on a substrate, encapsulated by a protective cover, and electrical contacts, according to different embodiments of the method of the invention.
Figure 7B:
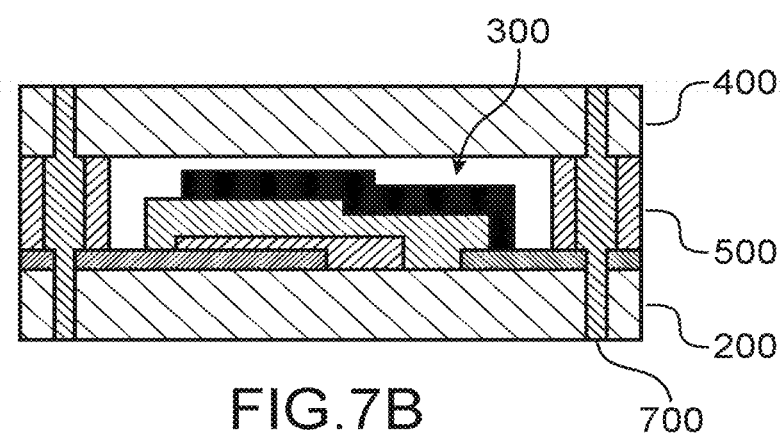
Figure 7C:
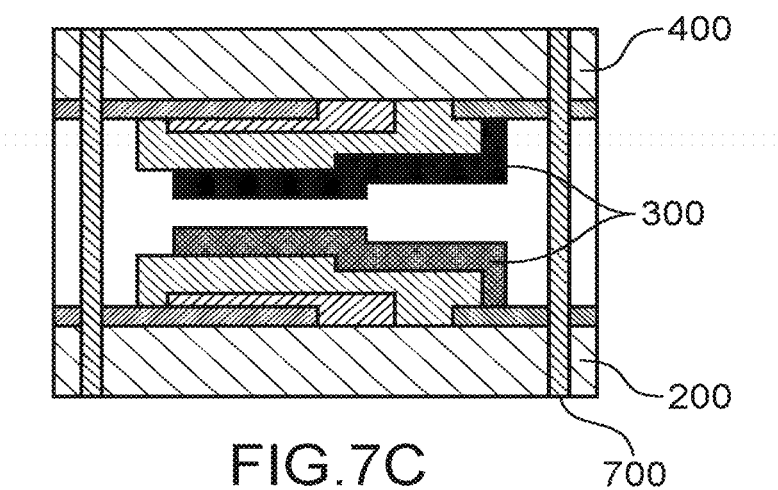

Finally, the microelectronic devices are separated individually to obtain unitary elements (FIGS. 7A, 7B and 7C).

The method of the present invention allows to encapsulate, in a grouped simultaneous manner, several microelectronic components disposed on the same substrate or on a substrate and on a cover and, more particularly, it allows to obtain a miniaturised microelectronic structure comprising a thin or ultra-thin substrate and/or cover.

Illustrative and Non-Limiting Example of an Embodiment of the Invention

This example relates to the thinning in a single step of an encapsulation cover 400 and of a rigid glass substrate 200 comprising lithium microbatteries 300.

Step 1: Performing the Stacking of Microbatteries:

Several lithium microbatteries were produced on a substrate 200 made of glass AF32 with a thickness of 500 µm. The total thickness variation (or TTV) is 1 µm. Microbatteries are produced by techniques known to the person skilled in the art. The microbatteries are positioned at a distance D from the edge of the rigid substrate. The minimum value of the distance D is equal to twice the thickness of the rigid substrate, namely here a value of 5 mm.

The current collectors are first deposited on the substrate. Then the cathode, the electrolyte and the anode are successively deposited.

The cathode is made of cobalt oxide ($LiCoO_2$) with a thickness of 20 µm obtained from a vacuum deposition (PVD for "Physical Vapour Deposition") followed by thermal annealing at 600° C. for 10 h.

The electrolyte is a 2 µm thick layer made of LiPON.

The negative electrode is a 2 µm thick layer of lithium metal.

Step 2: Depositing the Bonding Layer 500 and Positioning the Encapsulation Cover:

The bonding layer 500 is an epoxy polymer OG198-54, with a thickness of 20 µm, obtained by fixing by spin coating with a rotation rate of 1000 rpm for 40 s.

Once the encapsulation cover is positioned, a moderate force F (of the order of 2N) is applied on the encapsulation cover in order to guarantee homogeneous contact between the bonding layer 500 and the substrate containing the microbattery devices. A UV exposure is performed through the encapsulation cover using a dose of about 100 mWatt/$cm^{-2}$ within the wavelength range between 280 nm-800 nm for 2 mn. Then a thermal annealing for a duration of 20 minutes and at a temperature of 100° C. is finally carried out.

The encapsulation cover is also made of glass.

Step 3: Chemically Thinning the Basic Structure:

The chemical etching solution is an acid mixture between 10% HCl and 2% HF at 38° C. After etching, the host substrate and the encapsulation cover have a thickness of 50 µm each. The thickness tolerance after thinning is typically less than ±2%. The thinned glass surfaces have a TTV (Total Thickness Variation) whose maximum value is twice the input value before thinning. After thinning, the TTV is 2 µm for glasses AF32.

Step 4: Cutting the Basic Structure:

Making the openings as well as the cut in unit component are performed by 10 passes of a picosecond laser in the visible (530 nm) at an energy of 50 µl.

The 300 µm diameter openings are filled with a conductive resin E4110 marketed by the company Epo-Tek. A heat treatment at 150° C. for a duration of 15 minutes is carried out.

The microelectronic devices are then separated.

The invention claimed is:

1. A method for encapsulating a microelectronic device, disposed on a support substrate, with an encapsulation cover comprising the following successive steps:
    a) providing a support substrate, made of a first material, comprising a first main face on which a microelectronic device is disposed, and a second main face opposite the first main face,
    b) depositing a bonding layer, made of a second material, on the first main face of the substrate, around the microelectronic device,
    c) positioning an encapsulation cover, made of a third material, comprising a third main face and a fourth main face, opposite the third main face, on the bonding layer, so as to fix the third main face of the encapsulation cover on the support substrate, and so as to encapsulate the microelectronic device,
    d) thinning simultaneously, by chemical etching, the second main face of the support substrate and the fourth main face of the encapsulation cover to a thickness less than 200 µm.

2. The method according to claim 1, wherein the second main face of the support substrate and the fourth main face of the encapsulation cover are thinned to a thickness less than or equal to 100 µm.

3. The method according to claim 1, wherein the second main face of the support substrate and the fourth main face of the encapsulation cover are thinned to a thickness less than 50 μm.

4. The method according to claim 1, wherein the first material and/or the third material are selected from glass and silicon.

5. The method according to claim 1, wherein the first material and the third material are identical.

6. The method according to claim 1, wherein the first material and the third material are different.

7. The method according to claim 1, wherein during step b), the bonding layer completely covers the microelectronic device.

8. The method according to claim 1, wherein during step b), the bonding layer forms a sealing bead around the microelectronic device.

9. The method according to claim 8, wherein the sealing bead is made of glass paste, and wherein the sealing bead is surrounded by a protective layer made of a fourth material.

10. The method according to claim 9, wherein the fourth material is a polymer material selected from epoxides, ethers, polysiloxanes, acrylics, one of their copolymers, and polyethylene terephthalate.

11. The method according to claim 1, wherein the second material is a polymer material selected from epoxides, ethers, polysiloxanes, acrylics, one of their copolymers, and polyethylene terephthalate.

12. The method according to claim 1, wherein the microelectronic device is an electrochemical device.

13. The method according to claim 12, wherein the microelectronic device is a lithium microbattery.

14. The method according to claim 1, wherein several identical or different microelectronic devices are disposed on the first face of the support substrate and/or on the third main face of the encapsulation cover.

15. A microelectronic structure, obtained by the method according to claim 1, comprising a microelectronic device, disposed on a support substrate, made of a first material, said device being surrounded by a bonding layer, made of a second material, on which is fixed an encapsulation cover, made of a third material, the encapsulation cover and/or the support substrate having a thickness less than 200 μm, the bonding layer completely covering the microelectronic device or the bonding layer forming a sealing bead, made of glass paste, around the microelectronic device, the sealing bead being surrounded by a protective layer made of a fourth material.

16. The structure according to claim 15, wherein the first material and/or the third material are selected from glass and silicon.

17. The structure according to the claim 15, wherein the encapsulation cover and/or the support substrate have a thickness less than or equal to 100 μm.

* * * * *